(12) United States Patent  
Rousseau et al.

(10) Patent No.: US 9,162,870 B2  
(45) Date of Patent: Oct. 20, 2015

(54) LINEAR FLUIDIC ACTUATOR

(75) Inventors: Benjamin Rousseau, Charenton le Pont (FR); Thierry Bonnin, Charenton le Pont (FR); Jean Taboury, Sceaux (FR); Raymond Mercier, Antony (FR); Sylvain Perrot, Palaiseau (FR)

(73) Assignee: ESSILOR INTERNATIONAL (COMPAGNIE GENERALE D'OPTIQUE), Charenton le Pont (FR)

( * ) Notice: Subject to any disclaimer, the term of this patent is extended or adjusted under 35 U.S.C. 154(b) by 343 days.

(21) Appl. No.: 13/056,564

(22) PCT Filed: Jul. 24, 2009

(86) PCT No.: PCT/EP2009/059607  
§ 371 (c)(1),  
(2), (4) Date: Jan. 28, 2011

(87) PCT Pub. No.: WO2010/012666  
PCT Pub. Date: Feb. 4, 2010

(65) Prior Publication Data  
US 2011/0192998 A1   Aug. 11, 2011

(30) Foreign Application Priority Data

Jul. 28, 2008 (EP) .................................. 08305428

(51) Int. Cl.  
*B81B 3/00* (2006.01)  
*F15B 15/10* (2006.01)  
*F15B 15/14* (2006.01)

(52) U.S. Cl.  
CPC ............... *B81B 3/0027* (2013.01); *F15B 15/10* (2013.01); *F15B 15/1404* (2013.01)

(58) Field of Classification Search  
CPC ..... G02C 7/041; F15B 15/1404; F15B 15/10; B81B 3/0027  
USPC .......... 251/57, 61, 61.2; 351/159.04; 359/665  
See application file for complete search history.

(56) References Cited

U.S. PATENT DOCUMENTS

| | | | | |
|---|---|---|---|---|
| 5,596,781 | A * | 1/1997 | Graebe | 5/710 |
| 6,352,336 | B1 * | 3/2002 | Bisberg et al. | 347/55 |
| 6,612,535 | B1 * | 9/2003 | Tai et al. | 251/11 |
| 6,935,743 | B2 * | 8/2005 | Shadduck | 351/159.04 |
| 7,246,524 | B1 * | 7/2007 | Kholwadwala et al. | 73/715 |
| 7,438,723 | B2 * | 10/2008 | Esch | 623/6.13 |
| 7,485,144 | B2 * | 2/2009 | Esch | 623/6.13 |
| 8,056,881 | B2 * | 11/2011 | Landers et al. | 251/129.06 |
| 2004/0240076 | A1 * | 12/2004 | Silver | 359/666 |

* cited by examiner

*Primary Examiner* — Kevin Murphy  
*Assistant Examiner* — Daphne M Barry  
(74) *Attorney, Agent, or Firm* — Cozen O'Connor

(57) ABSTRACT

A linear fluidic actuator comprising an upper actuation deformable surface suitable to induce a displacement in an actuation direction L and a wall delimiting an internal cavity wherein the shape of the actuator is a pillar; the wall, the cavity and the upper surface of a base form the lower part of said pillar, where h1 is the highest dimension of the internal cavity at rest according to the actuation direction L; a part forms the upper part of said pillar where the upper surface of said upper part is the upper actuation deformable surface, the bottom surface of said upper part closes the upper part of the cavity so as to form an upper surface of said cavity and where h2 is the distance at rest from the top of the upper surface of the internal cavity to the upper actuation deformable surface; the height ratio h1/h2 is comprised between 0.2 and 10; a fluidic inlet is provided and suitable for introducing a fluid in the internal cavity.

17 Claims, 11 Drawing Sheets

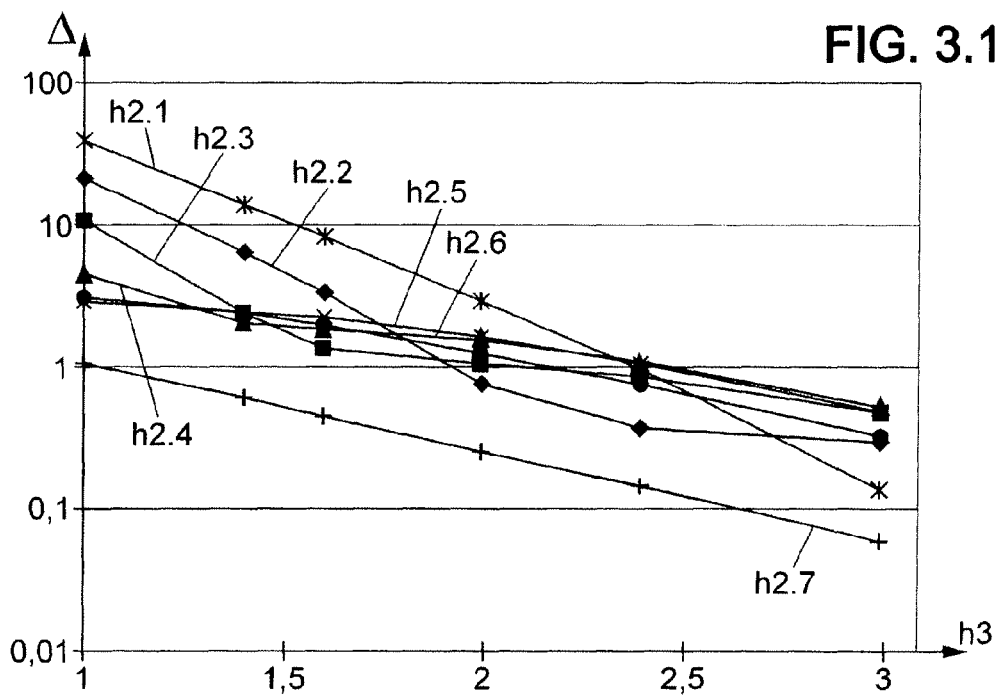
FIG. 3.1
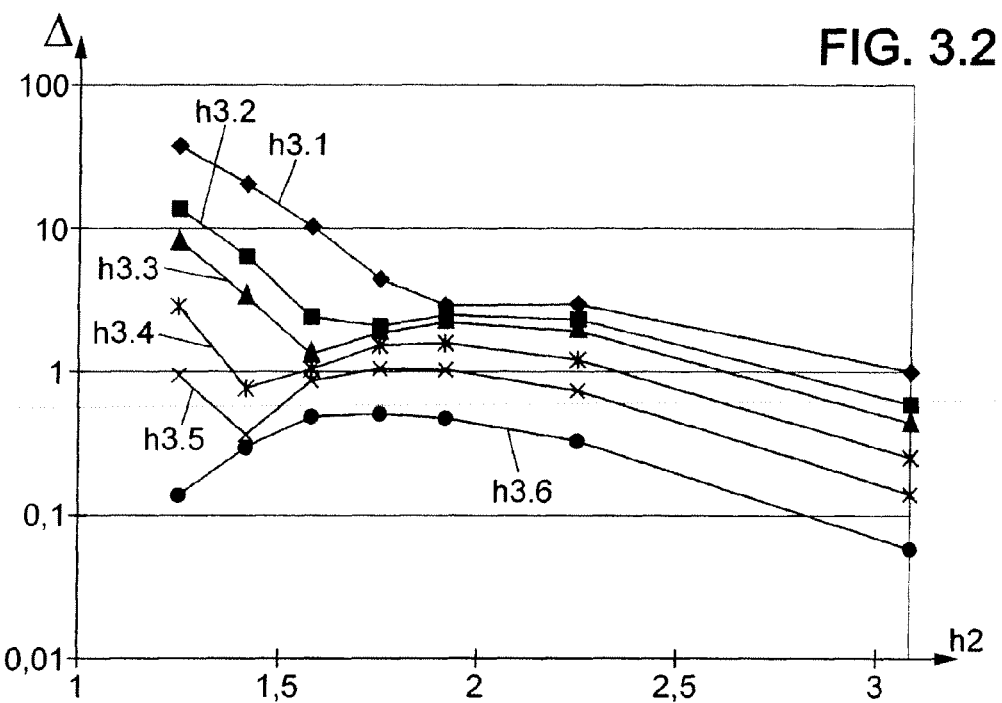
FIG. 3.2

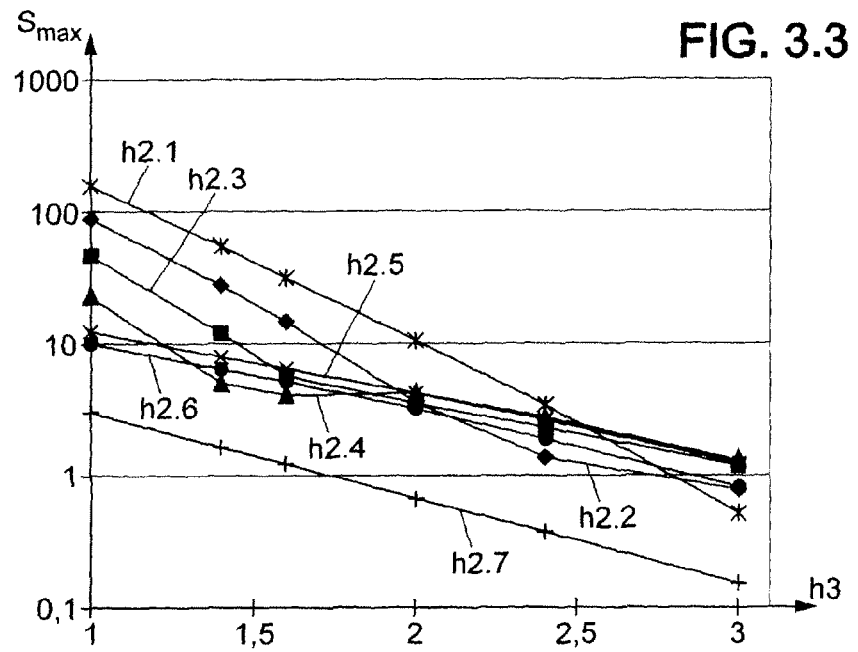
FIG. 3.3
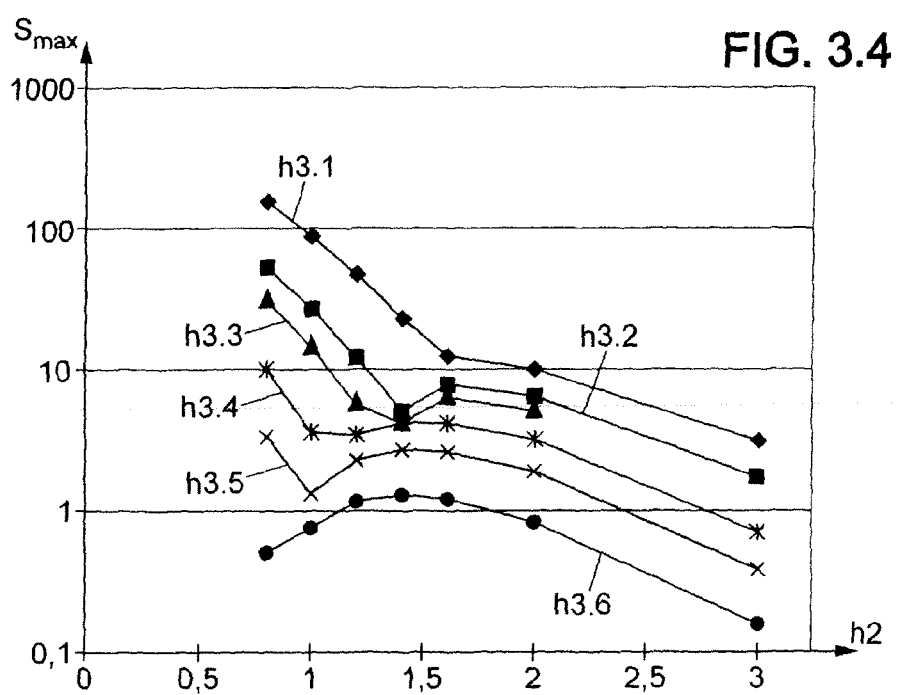
FIG. 3.4

LINEAR FLUIDIC ACTUATOR

RELATED APPLICATIONS

This is a U.S. National Phase Application under 35 USC 371 of International Application PCT/EP2009/059607 filed on Jul. 24, 2009.

This application claims the priority of European application no. 08305428.8 filed Jul. 28, 2008, the entire content of which is hereby incorporated by reference.

BACKGROUND OF THE INVENTION

The present invention relates to linear fluidic actuators.

Fluidic actuators convert energy in the form of a pressurized fluid into motion. The motion can be rotary or linear, depending on the type of actuator.

More particularly the present invention relates to linear fluidic actuators.

Linear fluidic actuators can be used to move a wide range of parts.

The term fluid refers either to gases or to liquids.

It is desirable to develop linear fluidic actuators that can be used to move parts with a wide displacement range but which size remains reasonable.

SUMMARY OF THE INVENTION

One object of the present invention is to provide a linear fluidic actuator that can afford a large displacement of a part with a compact structure This object is obtained according to an aspect of the invention directed to a linear fluidic actuator comprising an upper actuation deformable surface suitable to induce a displacement in an actuation direction L and a wall delimiting an internal cavity wherein:
  the shape of the actuator is a pillar;
  the wall, the cavity and the upper surface of a base form the lower part of said pillar, where h1 is the highest dimension of the internal cavity at rest according to the actuation direction L;
  a part forms the upper part of said pillar where the upper surface of said upper part is the upper actuation deformable surface, the bottom surface of said upper part closes the upper part of the cavity so as to form an upper surface of said cavity and where h2 is the distance at rest from the top of the upper surface of the internal cavity to the upper actuation deformable surface;
  the height ratio h1/h2 is comprised between 0.2 and 10;
  a fluidic inlet is provided and suitable for introducing a fluid in the internal cavity.

According to different embodiments of the present invention that may be combined:
  the height ratio h1/h2 is equal or greater to 0.5 and/or equal or less to 2;
  the pillar is a cylinder which axis extends in the actuation direction L;
  the thickness of the wall is between 0.1 to 2 mm, as for an example equal or greater to 0.25 mm and/or equal or less to 0.75 mm;
  the wall and the upper part are made of a polymeric material such as for example silicone or acrylic polymer;
  the Young modulus of the material of the wall and of the upper part is comprised between 1000 and 10000 N/m$^2$;
  the base is rigid; according to an embodiment the base is made of glass.

According to the present invention, the wording "pillar" is a part onto which another part may be arranged. As for an example a pillar according to the present invention is an elongated part.

According to non limiting embodiments, such a pillar may be of constant section, such as for examples a circle, a square, a hexagon; it may also be of variable sections, or be formed by several parts of constant sections with at least two different sections.

According to the present invention and thanks to the features of the linear fluidic actuator one can afford large displacement ranges of a part with a compact structure.

It is possible to use said linear fluidic actuators to push or to pull a deformable surface thus allowing shaping rapidly and reversibly a very wide range of complex surfaces.

It is also possible to use said linear fluidic actuators to push or to pull other parts, such as for example non-optical deformable surfaces, e.g. metallic or non-metallic sheets.

Another aspect of the invention relates to an actuator layer comprising a plurality of linear fluidic actuators.

According to an embodiment, the actuators are arranged on a substrate forming a common base for the linear fluidic actuators.

According to an embodiment, the actuators are arranged so as to form a regular array.

Another aspect of the invention relates to an adjustable surface device comprising:
  a material layer with said upper deformable surface and a bottom surface,
  a previously mentioned actuator layer where the linear fluidic actuators are separated by at least one cavity.

According to an embodiment, the layer thickness ratio h3/h4 is comprised between 0.1 and 1, as for an example equal or greater to 0.2 and/or equal or less to 0.5, where h3 is the highest dimension at rest of the material layer according to the actuation direction L and h4 is the highest dimension at rest of the actuator layer according to the actuation direction L.

According to an embodiment, h3 is comprised between 1 to 10 mm as for an example is equal or greater to 2 mm and/or equal or less to 5 mm.

Another aspect of the present invention related to a method for adjusting an adjustable surface device wherein a plurality of fluidic pressures (P1, P2, . . . ) is provided within the internal cavities of the linear fluidic actuators and a constant pressure Po is provided within the cavity(ies) which separate(es) the linear fluidic actuators.

Another aspect of the present invention relates to a method for manufacturing a previously mentioned adjustable surface device comprising the steps of:
  providing a mould with a plurality of closed shapes defining the external contours of the cavities of the actuator layer;
  providing at least the wall material by moulding.

According to the present invention a fluid can be a liquid or a gas.

In the frame of the present invention, the wordings "upper", "bottom" or "lower", "on", "under" indicate positions relative to an axis perpendicular to the upper actuation deformable surface at rest of a fluidic linear actuator. Said upper actuation deformable surface position is purely conventionally considered as an upper surface, without any prejudice of its actual spatial position.

According to an embodiment the upper actuation deformable surface is flat at rest.

According to another embodiment the upper actuation deformable surface is curved at rest.

BRIEF DESCRIPTION OF THE DRAWINGS

The novel features of this invention, as well as the invention itself, both as to its structure and its operation, will be best understood from the accompanying non limiting drawings and examples, taken in conjunction with the accompanying description, in which like reference characters refer to similar parts, and in which:

FIGS. 3.1 to 3.4 show surface parameters of displaced deformable surfaces thanks to embodiments of adjustable surface devices of the invention;

FIGS. 7-1 to 7-10 show different embodiments of a pillar linear fluidic actuator according to the present invention;

FIG. 8 shows another partial diagrammatic section of an adjustable surface device according to an embodiment of the present invention;

FIGS. 9 and 10 show moulds and injection moulding devices that can be used to manufacture components of an adjustable surface device according to an embodiment of the present invention.

DETAILED DESCRIPTION OF THE DRAWINGS

Skilled artisans appreciate that elements in the figures are illustrated for simplicity and clarity and have not necessarily been drawn to scale.

For example, the dimension of some of the elements in the figures may be exaggerated relative to other elements to help improve the understanding of the embodiment of the present invention.

Figure 1:
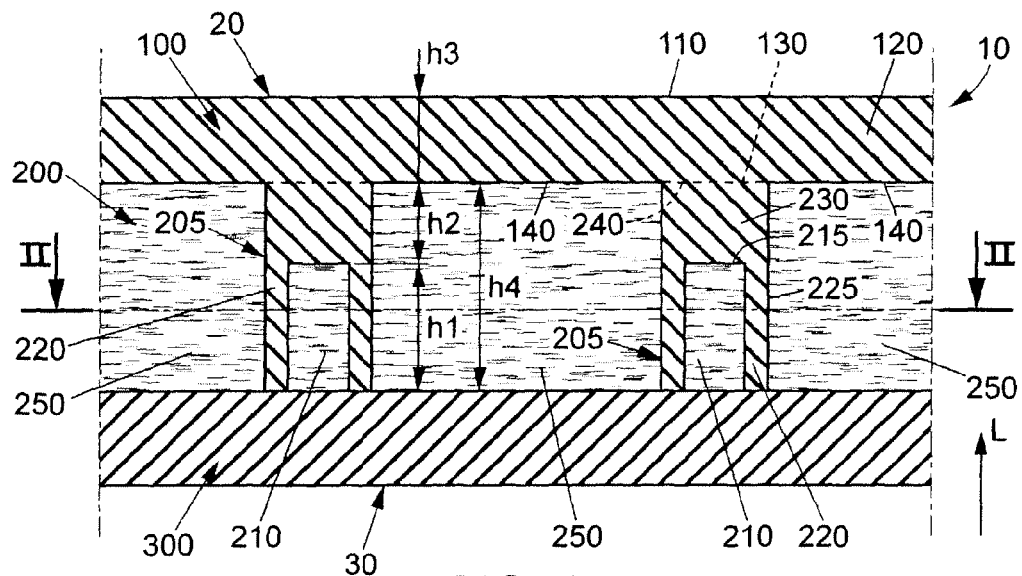
FIG. 1 shows a partial diagrammatic section of an adjustable surface device according to an embodiment of the present invention.

The adjustable surface device 10 of FIG. 1 comprises three layers of material stacked one upon the other.

The bottom layer 300 is a non deformable layer of constant thickness acting as a substrate.

The intermediate layer 200 comprises a plurality of pillar linear fluidic actuators 205. The thickness of said actuator layer 200 is at rest h4.

The upper layer 100 is a deformable material layer which thickness at rest is h3. According to this embodiment, the material layer 100 consists of only one material layer 120.

According to other embodiments (not shown), the material layer 100 consists of a plurality of material layers stacked one upon the others.

According to a non-limiting embodiment, the plurality of pillar linear fluidic actuators 205 forms an array.

According to a non-limiting embodiment, the distance between the centers of the pillar linear fluidic actuators is constant. Said distance may be for example comprised between 2 mm and 20 mm, as for example equal or greater to 5 mm and/or equal or less than 10 mm.

The deformable material layer 100 comprises an upper deformable surface 110 on which a surface 20 is provided. The surface 20 may be the surface 110 itself, or can be stacked on the deformable surface 110 and, as for an example, be coated on said surface.

According to a non-limiting embodiment, the bottom layer 300 is made of glass.

The actuator layer 200 comprises an array of pillar linear fluidic actuators 205 separated by one sole cavity 250.

Each pillar linear fluidic actuator 205 comprises a wall 220 delimiting an internal cavity 210 in which a fluid can be provided.

The pillars extend at rest in a L direction perpendicular to the bottom surface 130, 140 of the material layer 100. The L direction is the actuation direction. According to said embodiment, they extend at rest also perpendicularly to the surface 20.

A pillar linear fluidic actuator 205 comprises a lower part, consisting of the wall 220 and the cavity 210, and an upper part 230.

The height of a pillar linear fluidic actuator at rest is h4 and corresponds to the thickness of the actuator layer 200; the height of the lower part is h1 and the height of the upper part is h2, where h1+h2=h4.

The upper part 230 is full and made of the same material as wall 220. The pillar linear fluidic actuator 205 has a cylindrical external surface 225 which axis extends in the L direction.

The internal cavity 210 of a pillar linear fluidic actuator 205 is a cylinder which axis extends in the L direction. The upper surface 215 of the cavity 210 is flat.

Figure 2:
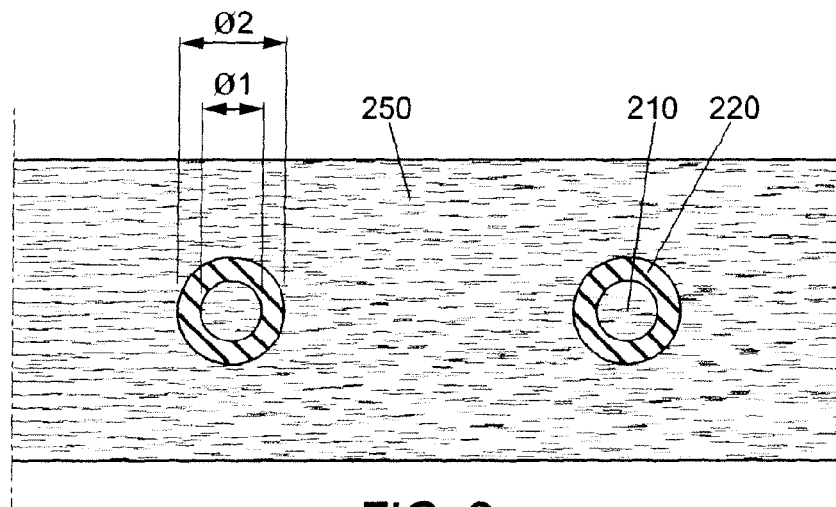
FIG. 2 shows a partial cross section of the adjustable surface device of FIG. 1 according to II-II section.

As shown on FIG. 2, the diameter of the cylindrical external surface 225 is ø2 and the diameter of the internal cylindrical cavity 210 is ø1.

The pillar linear fluidic actuator has an upper surface 240 contacting bottom surface zones 130 of the material layer 100. Said surface 240 is an upper actuation deformable surface and is suitable to induce a displacement in the actuation direction L.

According to the embodiment of FIG. 1, the pillar linear fluidic actuators 205 and the material layer 100 are continuously made of the same material. The link between upper surfaces 240 of the pillar linear fluidic actuators and bottom surface zones 130 of the material layer 100 is thus continuous. It would also be possible to design discontinuously the pillar linear fluidic actuators 205 and the material layer 100 and to joint them continuously by sticking or gluing. The substrate layer 300 comprises fluidic inlets (not represented here) in connexion with the internal cavities 210 of the pillar linear fluidic actuators 205.

Said fluidic inlets may be connected to fluidic control parts which may not be part of the adjustable surface device 10 itself. External fluid reservoirs and hydraulic systems can be connected to the fluidic inlets thanks to channels designed in the substrate layer 300.

According to an embodiment, the pillar linear fluidic actuators 205 and the material layer 100 are all made of polymeric materials, such as silicone, silicone polymeric material, acrylic polymeric material, hydrogel polymeric material.

The fluid used in the linear fluidic actuators may be selected to have refractive index that meet those of the materials of the substrate layer 300 and of the pillar linear fluidic actuators 205. Said fluid may be for example made of liquid silicones; acrylic oils; solid silicones and water solutions; liquid silicones and solid PMA. Thus an effect of index matching may be achieved so as to render the solid structure undetectable in a desired region of the light spectrum. According to an embodiment said region of the light spectrum is the visible range; according to other embodiments said region of the light spectrum can be part of the UV range or part of the IR range.

The deformable surface 20 can be adjusted thanks to varying the fluidic pressure within the internal cavities 210 of the pillar linear fluidic actuators 205.

When the pressure within an internal cavity 210 is higher than the pressure in the surrounding cavity 250, the upper surface 215 of the cavity pushes the material layer 100. When the pressure within an internal cavity 210 is lower than the pressure of the surrounding cavity 250, the upper surface 215 of the cavity pulls the material layer 100.

According to the present invention, the value of h2 is not nil and the upper part 230 of the pillar linear fluidic actuator transmits the deformation of the upper surface 215 of the cavity to the bottom surface zone 130 of the material layer 100.

The inventors have demonstrated that said embodiment is of particular interest and allows smooth deformation of the material layer 100 and thus fine tuning of the deformable surface 20.

A pillar linear fluidic actuator according to the present invention is thus suitable to provide a very precise displacement of a part.

According to non limiting examples of adjustable surface devices of the present invention:
The pressure within the surrounding cavity 250 is the atmospheric pressure, Po;
The diameter of internal cylindrical cavity ø1 is 2 mm;
The diameter of cylindrical external surface of the wall ø2 is 3 mm;
The height h1 of the lower part of the pillar linear fluidic actuator, i.e. the height of the internal cavity 210 is 4 mm;
The height h2 of the upper part of the pillar linear fluidic actuator is chosen between 0.8 mm to 3 mm, namely chosen as following examples:
h2.1=0.8 mm;
h2.2=1 mm;
h2.3=1.2 mm;
h2.4=1.4 mm;
h2.5=1.6 mm;
h2.6=2 mm;
h2.7=3 mm;
The height h3 of the material layer 100 is chosen between 1 mm to 3 mm, namely chosen as following examples:
h3.1=1 mm;
h3.2=1.4 mm;
h3.3=1.6 mm;
h3.4=2 mm;
h3.5=2.4 mm;
h3.6.=3 mm;
The Young modulus of the material chosen for the pillar linear fluidic actuators 205 and the material layer 100 is 5000 N/m$^2$ and its Poisson's ratio is ν=0.5.

Tests have been made to characterize the geometry of the surface 20 when actuating it with a constant pressure, comprised between 1 and 2 kPa according to the geometry, in all the cavities 210 of the pillar linear fluidic actuators 205 and providing a uniform mean displacement of 500 μm of the upper surface 215 of the internal cavity 210.

According to the present specification, pressures refer to relative pressure compared to atmospheric pressure. Thus P=0 means that the pressure value is the atmospheric pressure.

Figures 1, 7:
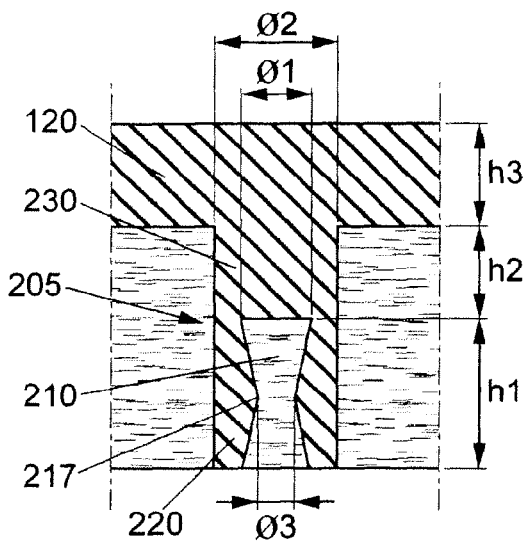
Figures 2, 7:
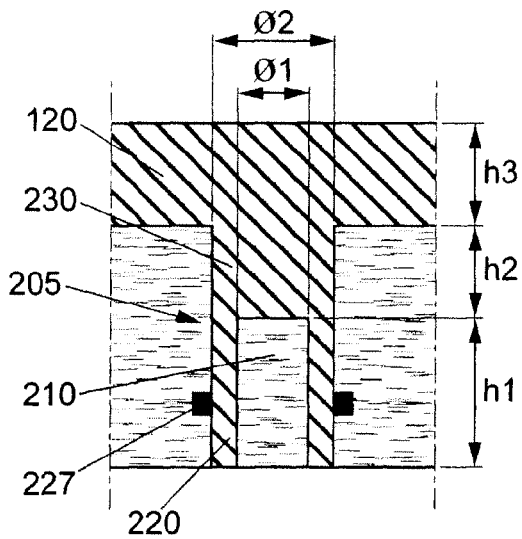
Figures 3, 7:
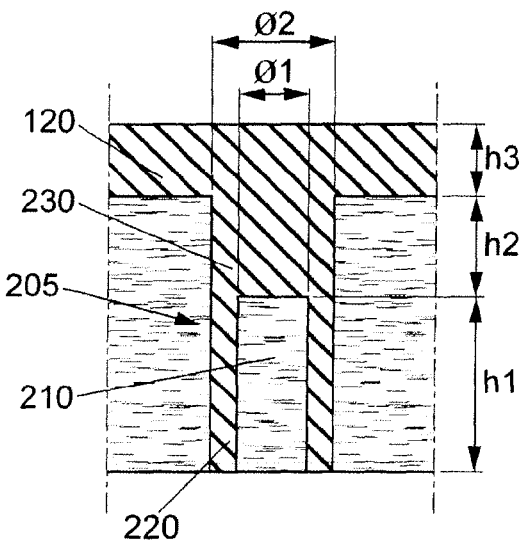
Figures 4, 7:
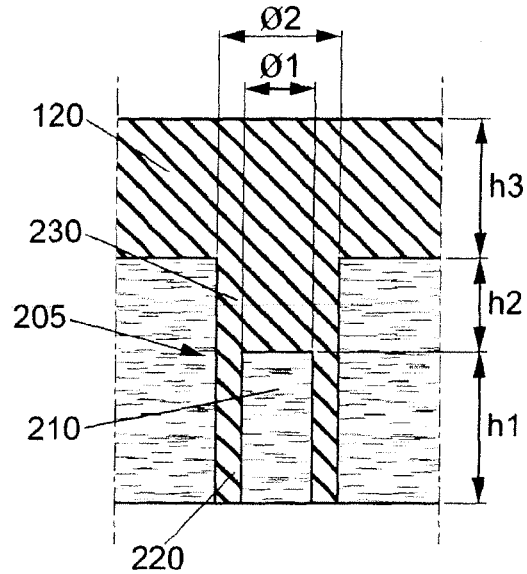
Figures 5, 7:
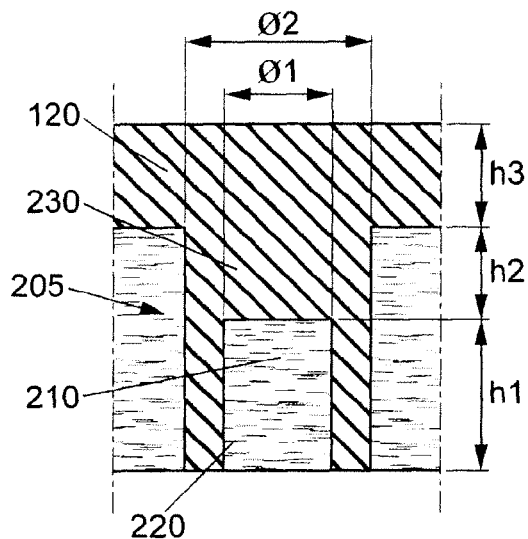
Figures 6, 7:
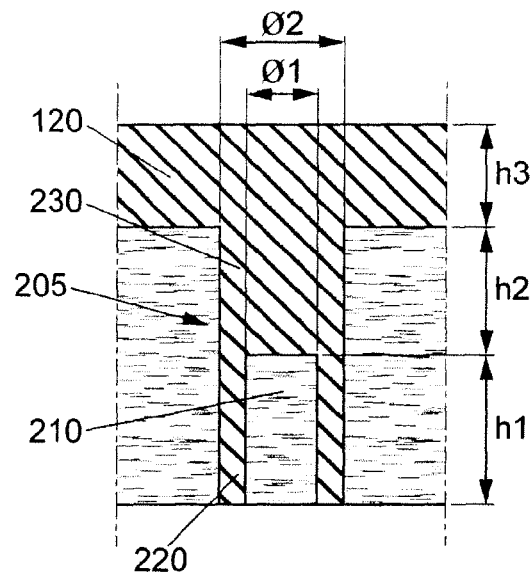
Figure 7:
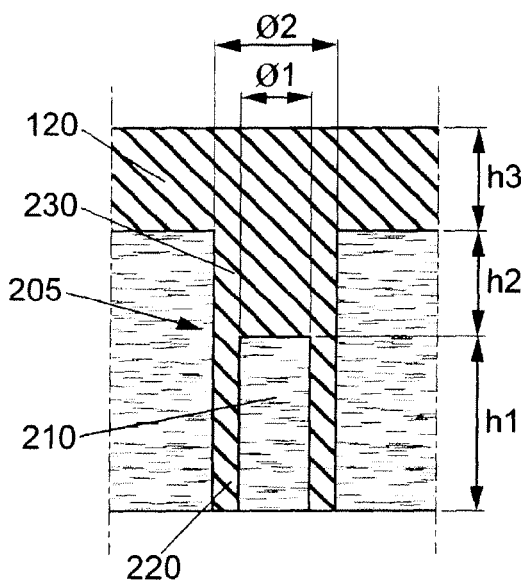

FIGS. 3.1 to 3.4 show the resulting surface 20 characteristics.

FIG. 3.1 shows the maximum peak to valley differences, Δ, in μm, between the actual surface 20 position and the surface 20 as it were translated from 500 μm as a function of the h3, for the 7 different values of h2, h2.1 to h2.7.

FIG. 3.2 shows the maximum peak to valley differences, Δ, in μm, between the actual surface 20 position and the surface 20 as it were translated from 500 μm as a function of h2, for the 6 different values of h3, h3.1 to h3.6.

FIG. 3.3 shows the maximum slope, Smax, in arc min, between the actual surface 20 position and the surface 20 as it were translated from 500 μm as a function of h3 for the 7 different values h2, h2.1 to h2.7.

FIG. 3.4 shows the maximum slope, Smax, in arc min, between the actual surface 20 position and the surface 20 as it were translated from 500 μm as a function of h2 for the 6 different values of h3, h3.1 to h3.6.

The man of the art is thus able to choose the geometrical parameters of the adjustable surface device according to the surface displacements and surface qualities he wishes.

It has been demonstrated that very low deformation levels can be reached, for example about 60 nm for h2=3 mm and h3=3 mm.

More complex surfaces have then been generated with preceding example where h2=h3=3 mm.

According to a first example, a square pillar array of linear fluidic actuators is used where firstly three and then four consecutive linear fluidic actuators are filled with fluid at different fluidic pressure in order to generate a slope on the deformable surface 20. The distance between the centers of the pillar linear fluidic actuators is 8 mm.

Using three consecutive pillar linear fluidic actuators different pressures of 1; 2; 3 kPa make possible generating a slope of 22 mrad where the maximum slope variation is about 400 μrad.

Using four consecutive pillar linear fluidic actuator different pressures of 0; 1; 2; 3 kPa make possible generating a slope of 22 mrad where the maximum slope variation is about 500 μrad.

The maximum slope variation was reduced when adjusting the fluidic pressure of the pillar linear fluidic actuator: a slope of 22 mrad with a slope variation of about 460 μrad was generated when using following pressures: 0; 1 kPa; 1.985 kPa; 2.985 kPa.

According to another example with the same adjustable surface device structure, a parabolic surface was generated.

Figure 4:
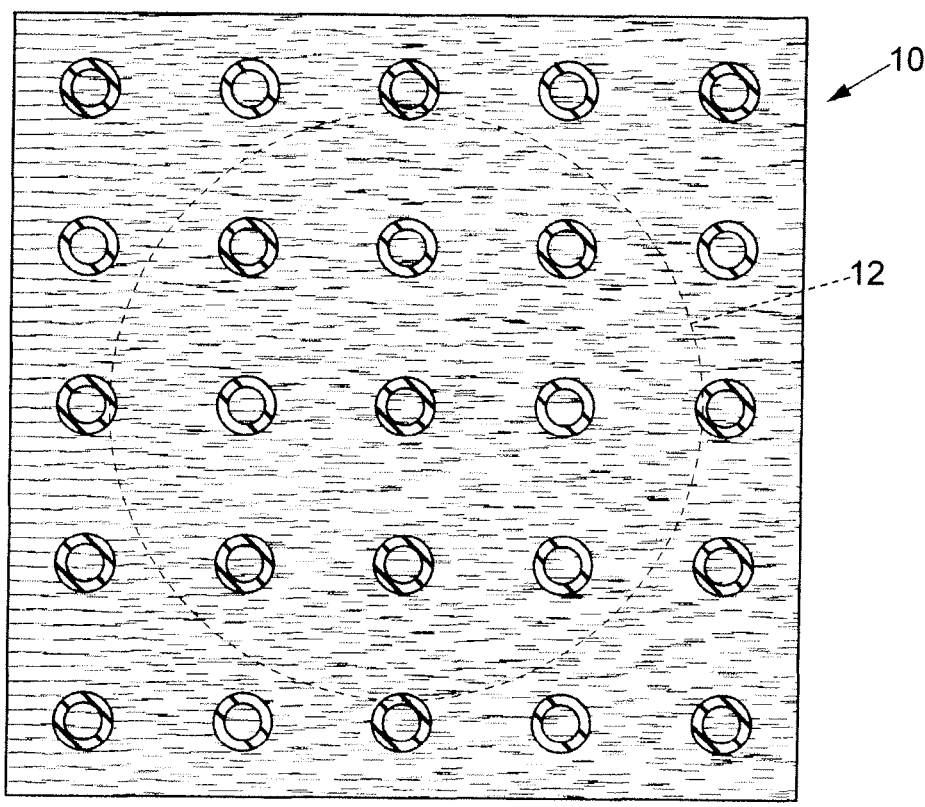
FIG. 4 shows an embodiment of the array of linear fluidic actuators according to the present invention.

FIG. 4 illustrates a square array consisting of 25 pillar linear fluidic actuators (with h2=h3=3 mm and a distance of 8 mm between the centers of the pillar linear fluidic actuators, according to preceding examples).

The pillar linear fluidic actuators are fed so as to generate a parabolic surface 20 close to a spherical surface within circle 12 (30 mm diameter circle); optimised pressures range between 170 to 3800 Pa.

The deformable surface 20 was parabolic with a top deformation of about 700 μm. The average curvature radius was 400 mm on a 30 mm diameter, the sag value was about 280 μm and the departure from sphere was about 1.8 μm RMS and 12.5 μm peak to valley.

Figure 5:
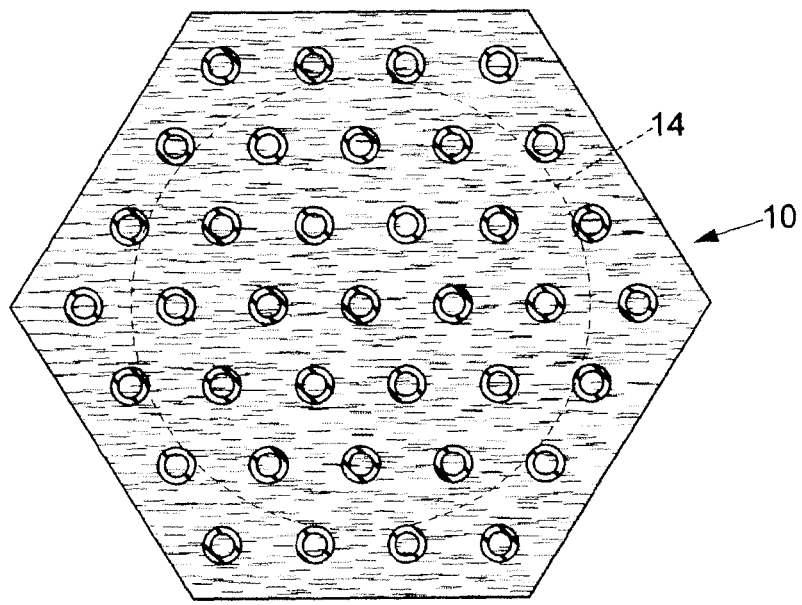
FIG. 5 shows another embodiment of the array of linear fluidic actuators according to the present invention.

FIG. 5 shows another pillar linear fluidic actuator spatial distribution where the array is hexagonal. 37 pillar linear fluidic actuators are arranged according to a hexagonal mesh and distance between the centers of the pillar linear fluidic actuators is 8 mm.

Figure 6:
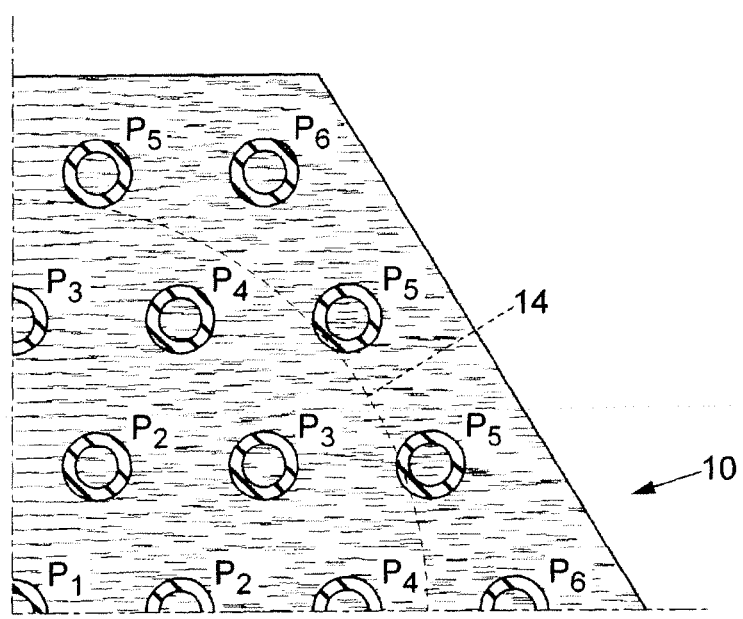
FIG. 6 shows an example of pressure repartition in linear fluidic actuators disposed according to FIG. 5.

FIG. 6 shows the pressure repartition used to generate a spherical surface 20 within a circle 14 which diameter is 40 mm.

According to an example:
P1=4925 Pa;
P2=4283 Pa;

P3=3476 Pa;
P4=3064 Pa;
P5=1043 Pa;
P6=0.

The average radius of curvature of the best sphere of the obtained surface was 399 mm; peak to valley maximal departure of the surface was less than about 16 μm and slope defects were less than 10 mrad on the whole sphere surface 20 (40 mm diameter).

Said variations were significantly reduced when considering a reduced zone: peak to valley maximum departure from the best sphere was less than about 8 μm and slope defects were less than about 2.5 mrad for a 35 mm diameter zone.

Pressure data was then re-optimized to reduce the defects on the reduced 35 mm diameter and very small surface variations were obtained with following pressure data:
P1=5014 Pa;
P2=4449 Pa;
P3=3546 Pa;
P4=3197 Pa;
P5=1267 Pa;
P6=0.

Peak to valley maximum variation was less than 5.6 μm and slope defects were less than about 2 mrad on the surface 20 of the sphere according to a 35 mm diameter. Very smooth surface can then be obtained.

According to other examples of the present invention, even more complex surfaces were generated.

As for an example, a complex surface close to the one of a progressive addition lens (PAL) was generated using an array of pillar linear fluidic actuators according to FIG. 5, where the distance between the centers of the pillar linear fluidic actuators is 5 mm and the circle 14 has a 25 mm diameter.

Said complex surface can be described using 66 Zernike polynomial functions with the coefficients of Table 1, where N corresponds to the order of the consecutive Zernike polynomial functions and "coef" corresponds to the coefficient used for corresponding Zernike polynomial function to describe the present surface.

TABLE 1

| N | Coef (μm) |
|---|---|
| 1 | −0.199 |
| 2 | 0 |
| 3 | −0.591 |
| 4 | −56.974 |
| 5 | −0.601 |
| 6 | 0 |
| 7 | 0 |
| 8 | 0 |
| 9 | 76.826 |
| 10 | 34.907 |
| 11 | −36.451 |
| 12 | −10.461 |
| 13 | 10.661 |
| 14 | 0 |
| 15 | 0 |
| 16 | 0 |
| 17 | 0 |
| 18 | 0 |
| 19 | −9.126 |
| 20 | −10.775 |
| 21 | −12.248 |
| 22 | −3.571 |
| 23 | 8.730 |
| 24 | 2.098 |
| 25 | −1.832 |
| 26 | 0 |
| 27 | 0 |

TABLE 1-continued

| N | Coef (μm) |
|---|---|
| 28 | 0 |
| 29 | 0 |
| 30 | 0 |
| 31 | 0 |
| 32 | 0 |
| 33 | 2.481 |
| 34 | 2.951 |
| 35 | 2.501 |
| 36 | −2.697 |
| 37 | 0.840 |
| 38 | 1.422 |
| 39 | −2.250 |
| 40 | −0.506 |
| 41 | 0.859 |
| 42 | 0 |
| 43 | 0 |
| 44 | 0 |
| 45 | 0 |
| 46 | 0 |
| 47 | 0 |
| 48 | 0 |
| 49 | 0 |
| 50 | 0 |
| 51 | −0.822 |
| 52 | −1.099 |
| 53 | −0.391 |
| 54 | 1.054 |
| 55 | 0.116 |
| 56 | 0.101 |
| 57 | −0.384 |
| 58 | −0.561 |
| 59 | 0.889 |
| 60 | 0.191 |
| 61 | −0.490 |
| 62 | 0 |
| 63 | 0 |
| 64 | 0 |
| 65 | 0 |
| 66 | 0 |

Preceding examples demonstrate that an adjustable optical device comprising at least a deformable optical surface activated by linear fluidic actuators according to the present invention afford large displacements of the deformable optical surface. Said displacements of the deformable optical surface may be of several 100 μm and possibly more than one mm.

Said displacements are obtained with a very compact structure; the ratio between the maximum displacements of the deformable optical surface to the thickness of the linear fluidic actuator(s) is highly advantageous; according to a non limiting example, an order of magnitude of said ratio is 0.1, corresponding for example to a 5 mm linear fluidic actuator suitable to induce a 500 μm deformable optical surface displacement.

Very efficient adjustable surface devices can thus be obtained.

Several other parameters of adjustable surface devices and pillar linear fluidic actuators according to the present invention were studied.

The geometry of the internal cavity 210 of pillar linear fluidic actuators 205 was studied in order to help designing optimum adjustable surface devices.

FIGS. 7.1 to 7.10 illustrate 10 different geometrical configurations, which are compared to the "standard" configuration according to FIG. 1.

The internal cavity 210 of FIG. 7.1 comprises a wall bulge 217 which internal diameter ø3 is 1.2 mm.

The wall 220 of FIG. 7.2 is restrained by a continuous ring 227.

The pillar's upper part 230 of FIG. 7.3 is higher than the one of FIG. 1 and the material layer 120 is thinner.

The pillar's upper part 230 of FIG. 7.4 is smaller than the one of FIG. 1 and the material layer 120 is thicker.

The internal diameter ø1 of FIG. 7.5 is greater than the one of FIG. 1.

The pillar's upper part 230 of FIG. 7.6 is higher than the one of FIG. 1 and the material layer 120 remains constant.

The height of the internal cavity 210 of FIG. 7.7 is higher than the one of FIG. 1 and the upper part and the material layer remain constant.

The form of the internal cavity 210 of FIG. 7.8 is modified compared to FIG. 1 and a concave surface 216 replaces the flat surface 215; a ring 232 is added in the upper part of the upper part 230.

The form of the internal cavity 210 of FIG. 7.9 is modified compared to FIG. 1 and a concave surface 216 replaces the flat surface 215.

The form of the internal cavity 210 of FIG. 7.10 is modified compared to FIG. 1 and a convex surface 217 replaces the flat surface 215

To determine the influence of the here above mentioned configuration on the surface 20, five linear pillar linear fluidic actuators were fed with fluid at five different pressures, P1, P2, P3, P4, P5 so as to obtain a 22 mrad slope.

The resulting surfaces were characterized and the data are reported in Table 1 for 11 configurations (FIG. 1 and FIGS. 7.1 to 7.10).

The maximum peak to valley, differences, Δ (in µm), and the maximum slope variation, "slope max" are reported (in arc minutes).

An estimation of the stresses within the material according to the different configurations was performed; the maximum compression stresses $S_{ii}$ and the maximum shear stresses $S_{ij}$ are reported in Table 2.

Upper part height h3 is comprised between 1 and 10 mm, as for an example is equal or greater to 2 mm and/or equal or less to 5 mm.

The layer thickness ratio h3/h4 is comprised between 0.1 and 1, as for an example equal or greater to 0.2 and/or equal or less to 0.5.

The height ratio h1/h2 is comprised between 0.2 and 10, as for an example equal or greater to 0.5 and/or equal or less to 2.

Said parameters ranges may be combined to select multi parameters adjustable surface device configurations.

Figures 7, 8:
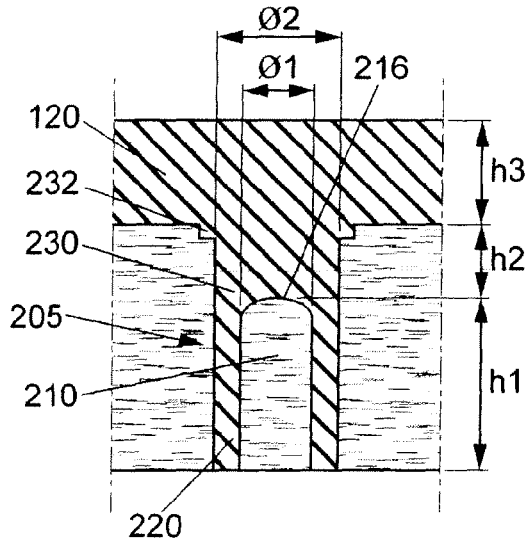

FIG. 8 illustrates another embodiment of the present invention where a second material 400 is arranged on the upper surface of the material layer 100. According to an embodiment, the material layer 400 is more rigid than the material layer 100 and is suitable to lower the surface defects of the deformable surface. Said deformable surface may be further smoothed thanks to material layer 400.

FIGS. 9a-b and 10a-b illustrate moulds and injection moulding devices that can be used to manufacture components of an adjustable surface device according to the invention.

Figure 9A:
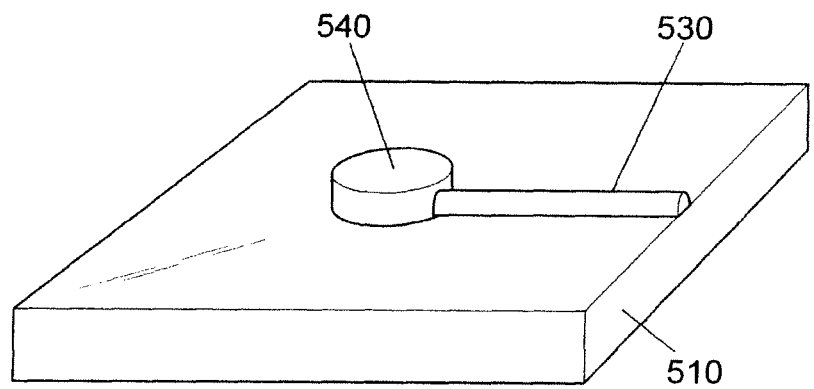
Figure 9B:
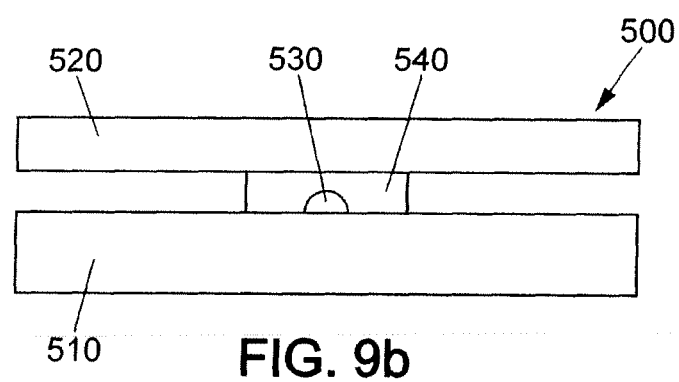

FIGS. 9a-b illustrate a mould 500 used to manufacture part of the substrate layer 300 where a full channel 530 and a full cylinder 540 are provided on a substrate plate 510. Full parts may be made of glass. A polymeric material is injected within the bottom substrate plate 510 and an upper plate 520.

Figure 10A:
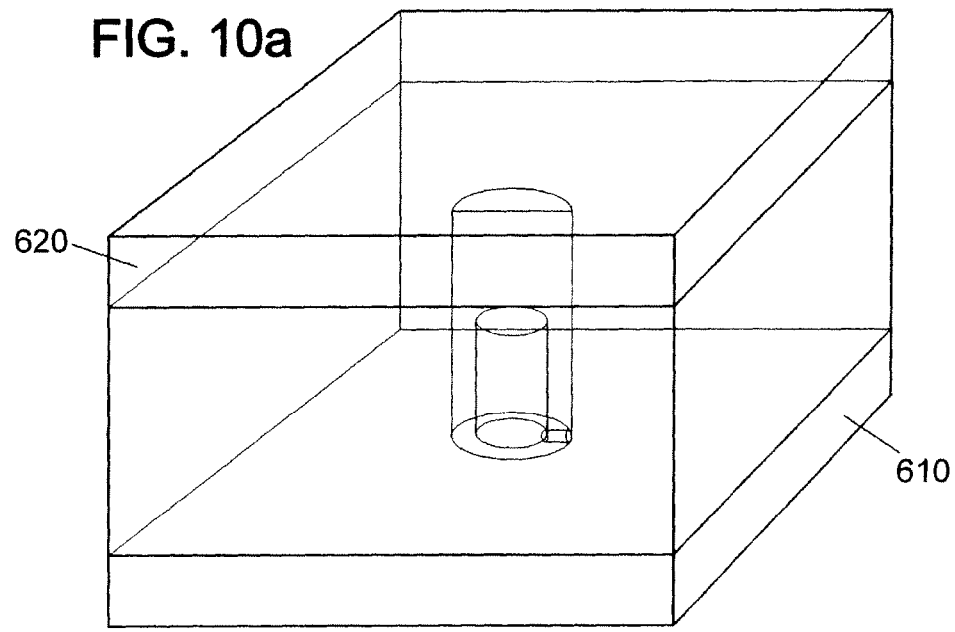
Figure 10B:
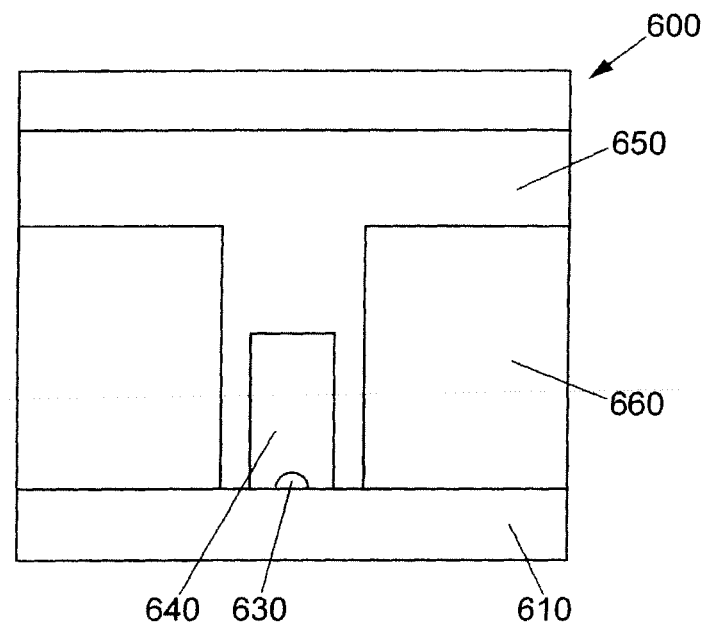

FIGS. 10a-b illustrate a mould 600 used to manufacture a pillar linear fluidic actuator 205 where a full channel part 630 and a full cylinder 640 are provided on a substrate plate 610. Full part 660 is provided around the full cylinder 640. Full parts may be made of glass. A polymeric material is injected within the bottom substrate plate 610 and an upper plate 620 within the space 650.

Figures 7, 8, 9:
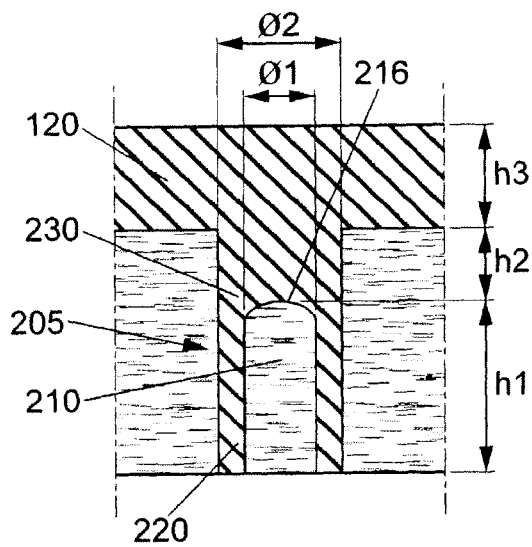
Figures 7, 8, 9, 10:
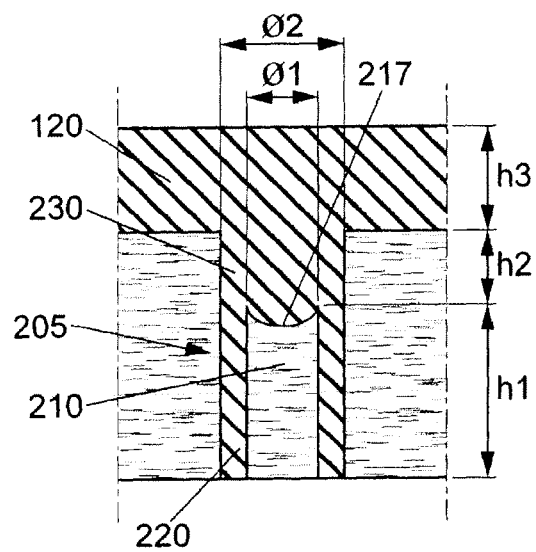
Figure 8:
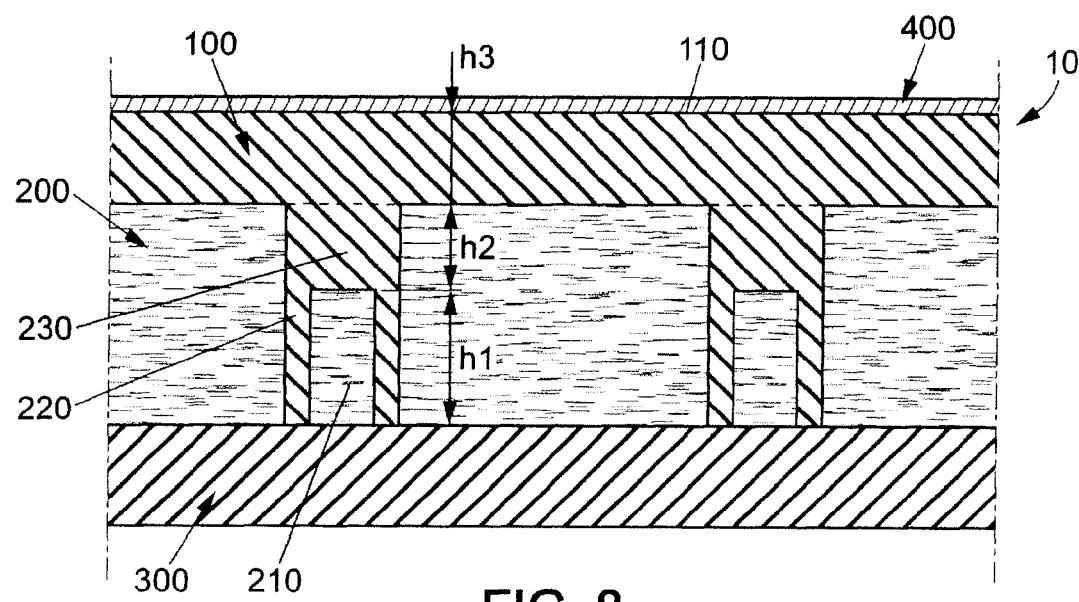

According to the manufacturing process of FIGS. 9 and 10, the polymeric part manufactured in FIG. 10 is placed on the

TABLE 2

| | Geometrical parameter of the pillar linear fluidic actuator | | | | | Pressure values for obtaining a 22 mrd slope | | | | | deformable surface 20 defects | | Resulting stresses | |
|---|---|---|---|---|---|---|---|---|---|---|---|---|---|---|
| | ø1 | ø2 | h1 | h2 | h3 | P1 | P2 | P3 | P4 | P5 | Δ (µm) | Slope max (arcmin) | $S_{ii}$ max (N/m²) | $S_{ij}$ max (N/m²) |
| FIG. 1 | 2 | 3 | 4 | 3 | 3 | 0 | 1009 | 1994 | 2980 | 3987 | 1.10 | 1.73 | 13686 | 6542 |
| FIG. 7.1 | 2 | 3 | 4 | 3 | 3 | 0 | 752 | 1491 | 2231 | 2981 | 1.10 | 1.74 | 4805 | 3947 |
| FIG. 7.2 | 2 | 3 | 4 | 3 | 3 | 0 | 538 | 1063 | 1589 | 2126 | 1.41 | 2.23 | 5395 | 2520 |
| FIG. 7.3 | 2 | 3 | 5 | 3 | 2 | 0 | 964 | 1912 | 2861 | 3823 | 2.72 | 4.59 | 12984 | 6170 |
| FIG. 7.4 | 2 | 3 | 4 | 3 | 4 | 0 | 1012 | 1997 | 2983 | 3993 | 0.48 | 0.70 | 13707 | 6553 |
| FIG. 7.5 | 3 | 4 | 4 | 3 | 3 | 0 | 571 | 1118 | 1669 | 2234 | 2.86 | 4.16 | 8668 | 4817 |
| FIG. 7.6 | 2 | 3 | 4 | 4 | 3 | 0 | 1009 | 1995 | 2981 | 3989 | 0.99 | 1.56 | 13692 | 6545 |
| FIG. 7.7 | 2 | 3 | 5 | 3 | 3 | 0 | 971 | 1918 | 2866 | 3836 | 0.96 | 0.61 | 13028 | 6191 |
| FIG. 7.8 | 2 | 3 | 4.5 | 2.5 | 3 | 0 | 1307 | 2585 | 3860 | 5169 | 1.04 | 1.47 | 17681 | 8456 |
| FIG. 7.9 | 2 | 3 | 4.5 | 2.5 | 3 | 0 | 1308 | 2588 | 3863 | 5174 | 1.19 | 1.82 | 17697 | 8463 |
| FIG. 7.10 | 2 | 3 | 4.5 | 2.5 | 3 | 0 | 900 | 1779 | 2659 | 3557 | 1.10 | 1.73 | 12224 | 5850 |

One can notice that when the thickness, h3, of the material layer 120 increases, the surface defects generally decrease, but the fluidic pressures to be introduced into the internal cavity 210 have to increase to obtain the same surface slope.

According to said experiments, following ranges of parameters values may be considered as being suitable for obtaining adjustable surface devices with interning surface properties thanks to the pillar linear fluidic actuators of the invention. It has to be noted that following ranges are not limiting the present invention and are given as illustrating examples:

Thickness of the pillar linear fluidic actuator is between 0.1 and 2 mm, as for an example equal or greater to 0.25 mm and/or equal or less than 0.75 mm.

polymeric part manufactured in FIG. 9 and pressed on it so that the polymeric material 650 enters in the cylindrical hole formed thanks to cylinder 540. The channels of both parts are connected and thus forming a fluidic inlet for the pillar linear fluidic actuator.

Said steps may be repeated to form an array of pillar linear fluidic actuators. More complex moulds based on the same principle can be provided in order to provide simultaneously a plurality of channels and a plurality of pillars linear fluidic actuators.

Thanks to pillar linear fluidic actuators and to adjustable surface devices according to the invention, numerous optical components may be realized, such as adjustable mirrors, adjustable intra ocular lenses and adjustable ophthalmic lenses.

Thanks to pillar linear fluidic actuators and to adjustable surface devices according to the invention, numerous non-optical components may be realized where parts and/or at least one surface are precisely actuated.

The invention has been described above with the aid of embodiments without limitation of the general inventive concept, in particular the adjustable surface device of the invention may be of various shapes and configurations not limited to the examples discussed.

The invention claimed is:

1. An adjustable optical surface device comprising:
a deformable optical surface; and
a plurality of linear fluidic actuators configured to selectively adjust the shape of the deformable optical surface, each of said plurality of linear fluidic actuators having:
   (i) an upper actuation deformable surface configured to induce a displacement in an actuation direction L to deform said deformable optical surface, and
   (ii) a wall delimiting an internal cavity,
wherein, for each of said plurality of linear fluidic actuators:
   each of said actuators is a pillar, the pillar comprising a lower part and an upper part,
   the wall and the internal cavity form the lower part of said pillar, where h1 is the height of the internal cavity at rest along the actuation direction L,
   the upper part of said pillar comprises an upper surface of said upper part of said pillar and a bottom surface of said upper part of said pillar, said upper surface of said upper part of said pillar being the upper actuation deformable surface, the bottom surface of said upper part of said pillar closing an upper part of the internal cavity so as to form an upper surface of said internal cavity, and where h2 is the distance at rest along the actuation direction L from the upper surface of said internal cavity to the upper actuation deformable surface,
   the height ratio h1/h2 is between 0.2 and 10, and
   a fluidic inlet is configured for introducing a fluid into the internal cavity;
said plurality of actuators are arranged so as to form an array that forms a progressive addition lens (PAL); and
the fluidic inlets of the actuators are in communication with a fluid source via a path configured such that the cavities of the respective actuators are fillable with fluid at a plurality of respective fluidic pressures, which plurality of respective fluidic pressures may be selectively different from one another.

2. The adjustable optical surface device of claim 1, wherein the height ratio h1/h2 is equal or greater than 0.5 and/or equal or less than 2.

3. The adjustable optical surface device of claim 1, wherein the pillar is a cylinder which axis extends in the actuation direction L.

4. The adjustable optical surface device of claim 1, wherein the thickness of the wall is between 0.1 to 2 mm.

5. The adjustable optical surface device of claim 1, wherein the wall and the upper part are made of a polymeric material such as for example silicone or acrylic polymer.

6. The adjustable optical surface device of claim 1, wherein the Young modulus of the material of the wall and of the upper part is comprised between 1000 and 10000 N/m$^2$.

7. The adjustable optical surface device of claim 1, wherein the base is rigid.

8. The adjustable optical surface device of claim 1, wherein the linear fluidic actuators are arranged in an actuator layer comprising a plurality of said linear fluidic actuators.

9. The adjustable optical surface device of claim 8, wherein the actuators are arranged on a substrate forming a common base for the linear fluidic actuators.

10. The adjustable optical surface device of claim 8, wherein the actuators are arranged so as to form a regular array.

11. The adjustable optical surface device of claim 8, wherein the linear fluidic actuators are separated by at least one cavity.

12. The adjustable optical surface device of claim 11, wherein the layer thickness ratio h3/h4 is between 0.1 and 1, where h3 is the highest dimension at rest of the material layer according to the actuation direction L and h4 is the highest dimension at rest of the actuator layer according to the actuation direction L.

13. The adjustable optical surface device of claim 12, where h3 is between 1 to 10 mm.

14. The adjustable optical surface device of claim 12, where h3 is equal or greater than 2 mm and/or equal or less than 5 mm.

15. A method for adjusting the adjustable optical surface device of claim 11, wherein a plurality of fluidic pressures is provided within the internal cavities of the linear fluidic actuators and a constant pressure Po is provided within the cavity(ies) which separate(es) the linear fluidic actuators.

16. The adjustable optical surface device of claim 11, wherein the layer thickness ratio h3/h4 is equal or greater than 0.2 and/or equal or less than 0.5, where h3 is the highest dimension at rest of the material layer according to the actuation direction L and h4 is the highest dimension at rest of the actuator layer according to the actuation direction L.

17. The adjustable optical surface device of claim 1, wherein the thickness of the wall is between 0.25 mm and 0.75 mm, inclusive.

* * * * *